(12) United States Patent
Zhang (10) Patent No.: US 8,611,173 B1
(45) Date of Patent: Dec. 17, 2013

(54) BUFFER CIRCUITRY WITH MULTIPORT MEMORY CELLS

(75) Inventor: Wei Zhang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 174 days.

(21) Appl. No.: 13/310,501

(22) Filed: Dec. 2, 2011

(51) Int. Cl.
*G11C 8/00* (2006.01)

(52) U.S. Cl.
USPC ............ 365/230.02; 365/230.05; 365/230.08; 365/236; 365/189.04

(58) Field of Classification Search
USPC .................. 365/230.02, 230.05, 230.08, 236, 365/189.04
See application file for complete search history.

(56) References Cited

U.S. PATENT DOCUMENTS

| | | | |
|---|---|---|---|
| 4,875,196 A * | 10/1989 | Spaderna et al. ............. | 365/238 |
| 6,072,741 A | 6/2000 | Taylor | |
| 6,424,591 B1 | 7/2002 | Yu et al. | |
| 6,542,973 B2 * | 4/2003 | Hsu et al. ...................... | 711/154 |
| 6,838,902 B1 | 1/2005 | Elftmann et al. | |
| 7,254,088 B2 * | 8/2007 | Kurumada et al. ...... | 365/230.05 |
| 2010/0082910 A1 | 4/2010 | Raikar et al. | |

OTHER PUBLICATIONS

Richard et al., U.S. Appl. No. 12/923,959 ,filed Jun. 25, 2010.

\* cited by examiner

*Primary Examiner* — Toan Le
(74) *Attorney, Agent, or Firm* — Treyz Law Group; Jason Tsai (57) ABSTRACT

Integrated circuits with first-in-first-out (FIFO) buffer circuits are provided. A FIFO may be implemented using multiport memory elements arranged in an array. The array may be coupled to first and second row address decoders and column multiplexers. The first and second row address decoders may be respectively controlled using first and second row address signals, whereas the column multiplexers may be controlled using column address signals. A FIFO control circuit may generate the row and column address signals. In one suitable arrangement, the FIFO control circuit may be configured to compare the first and second row address signals to determine whether read and write access requests can be simultaneously performed. In another suitable arrangement, the FIFO control circuit may be configured to monitor a count value reflective of the number of data words the FIFO is currently storing to determine whether simultaneous read and write access requests are permitted.

20 Claims, 7 Drawing Sheets

BUFFER CIRCUITRY WITH MULTIPORT MEMORY CELLS

BACKGROUND

A first-in-first-out circuit (sometimes referred to as a FIFO) is a buffer circuit often used in an integrated circuit for transferring data from one system domain to another. A FIFO has a first port at which input data can be received and a second port at which output data can be provided.

Data stored in the FIFO may be grouped into respective units sometimes referred to as data words. For example, consider a scenario in which the FIFO receives a first data word at a first point in time, a second data word at a second point in time after the first point in time, and a third data word at a third point in time after the second point in time. These data words are stored in the FIFO until they are read out. When reading out data from the FIFO, the first data word will be the first data to be presented at its output (because the first data word arrived at the FIFO prior to the second and third data words). The second and third data words can then be read out in that order.

A FIFO is typically implemented using an array of dual-port memory cells formed on an integrated circuit. The array of dual-port memory cells are arranged in rows and columns. Each dual-port memory cell along the same row is controlled using two corresponding address signals, whereas each dual-port memory cell along the same column is connected to two corresponding sense amplifiers. Each entry in the FIFO corresponds to a different group of dual-port memory elements in the array. Each dual-port memory cell has a write port and a read port. Operations performed using the read and write ports can be controlled using two independent clock signals (i.e., read and write requests for the FIFO can arrive asynchronously or synchronously).

Consider a scenario in which the conventional FIFO receives a read request and a write request synchronously and is configured to simultaneously write in a new data word and to read out an existing data word. If the FIFO is empty, only the write request will be serviced. If the FIFO is full, only the read request will be serviced. However if the FIFO is neither empty nor full, the write and read requests may be serviced in parallel. In this last scenario, if the group of cells to which the new data word is to be written and the group of cells from which the existing data word is to be read are located along the same address row, the dual-port memory performance may be substantially degraded. Performing simultaneous read and write accesses in this way may result in failed write operations, severely reduced read margins, and reduced die yield.

SUMMARY

This relates generally to integrated circuits and, more particularly, to integrated circuits with buffer circuits.

Buffer circuits such as first-in-first-out (FIFO) circuits may be implemented using an array of dual-port memory cells. The array of dual-port memory cells may be coupled to first and second row address decoders via associated word lines and may be coupled to first and second sets of column multiplexers via associated data lines. The data lines may be coupled to write driver circuitry configured to write a new data word into the array during write operations and may be coupled to read sensing circuitry configured to read an existing data word from the array during read operations.

The write driver and read sensing circuitry may be controlled using a FIFO control circuit. The control circuit may receive FIFO read/write access requests from other logic circuits and may be used to determine the order in which the received access requests are performed (e.g., whether the write access is performed before the read access, whether the write access can be performed simultaneously with the read access, etc.). The control circuit may include a counter that monitors of the number of data words that is currently being stored in the FIFO. The counter may have a value reflective of whether the FIFO is empty or full.

The FIFO control circuit may also be used to generate a first row address signal for controlling the first row address decoder, a second row address signal for controlling the second row address decoder, a first column address signal for controlling the first set of column multiplexers, and a second column address signal for controlling the second set of column multiplexers. In one suitable embodiment of the present invention, the first and second row address signals may be compared using the control circuit to determine whether read and write accesses can be fulfilled in parallel. If the first and second row address signals are different, the control circuit may grant simultaneous read/write access. If the first and second row address signals are identical, the control circuit may fulfill one access request at a time.

In another suitable embodiment of the present invention, the FIFO control circuit may determine whether read and write access can be fulfilled in parallel based on the value of the counter. For example, if the value of the counter is greater than zero and less than a first predetermined threshold value, simultaneously access will not be permitted (because the first and second row address signals are potentially identical). Similarly, if the value of the counter is greater than a second predetermined threshold value and less than FIFO size, simultaneously access will not be granted (because the first and second row address signals may be identical). If the value of the counter is between the first and second predetermined threshold values, it is not possible for the first and second row address signals to be equal, so simultaneously read/write access may be granted.

Further features of the present invention, its nature and various advantages will be more apparent from the accompanying drawings and the following detailed description.

DETAILED DESCRIPTION

Embodiments of the present invention relate to integrated circuits with buffer circuits and, more particularly, to buffer circuits such as first-in-first-out (FIFO) circuits. The FIFO of the present invention may be used in any suitable integrated circuit. For example, the memory circuitry may be used in an integrated circuit such as an application specific integrated circuit (ASIC), a programmable integrated circuit, or other types of integrated circuits.

Figure 1:
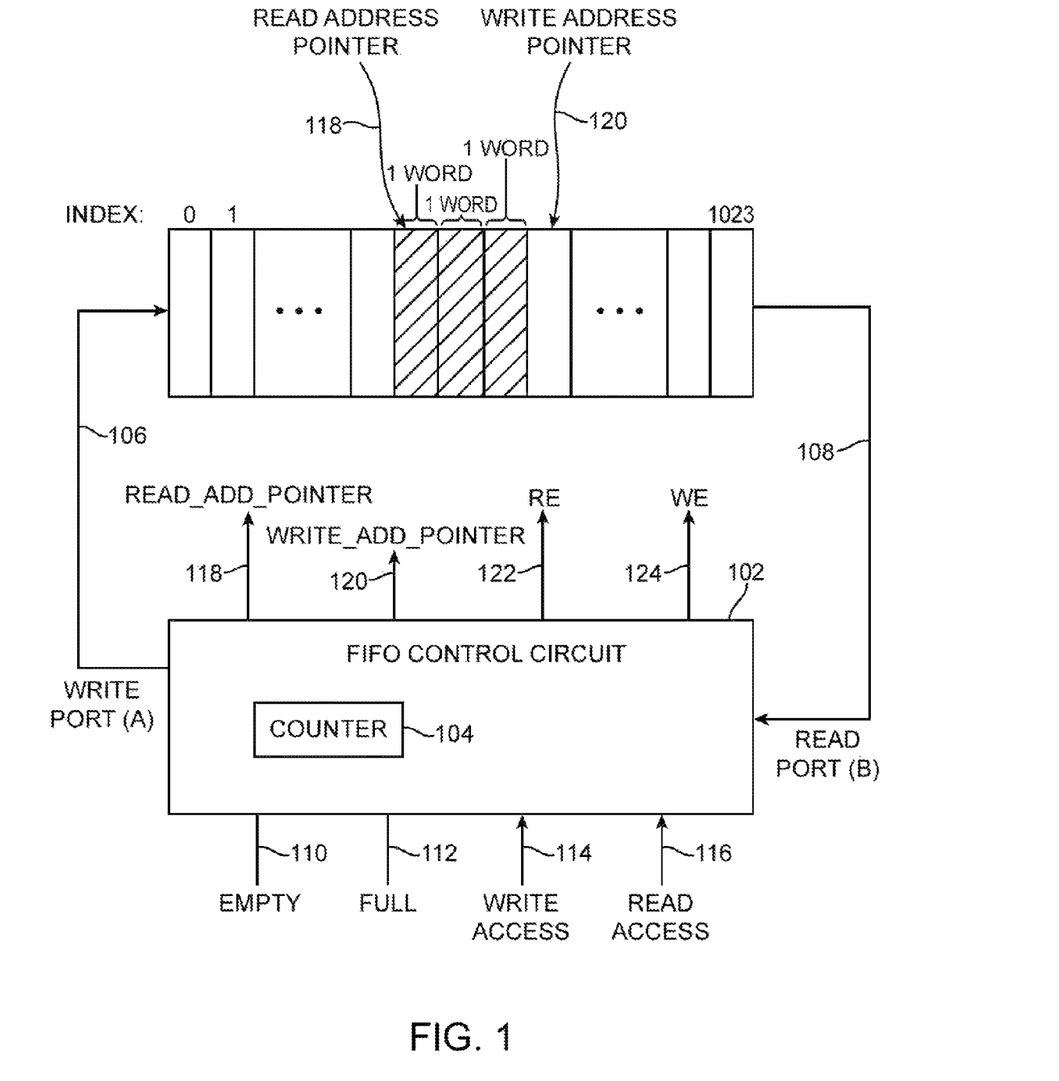
FIG. 1 is a diagram of an illustrative integrated circuit having a first-in-first-out (FIFO) circuit in accordance with an embodiment of the present invention.

FIG. 1 is a diagram of an integrated circuit 10 that includes a FIFO circuit (referred to herein as a FIFO) such as FIFO 100 and an associated FIFO control circuit 102. FIFO control circuit 102 may be considered to be part of FIFO 100. As shown in FIG. 1, FIFO 100 may have multiple slots (or entries) each of which is configured to store a group of data bits sometimes referred to collectively as a "data word." A data word may, for example, include four data bits, ten data bits, fifty data bits, or any suitable number of bits. FIFO 100 may have an input port (e.g., a write port referred to herein as port A) that is coupled to FIFO control circuit 102 via path 106 and an output port (e.g., a read port referred to herein as port B) that is coupled to FIFO control circuit 102 via path 108.

FIFO control circuit 102 may receive FIFO write access requests and read access requests from logic circuitry and/or other digital circuitry formed on device 10. The write access requests may be received via input path 114, whereas the read access requests may be received via input-output (I/O) path 116. Data read out from FIFO 100 may be provided over path 116. FIFO control circuit 102 may also keep track of a write address pointer indicative of a location within FIFO 100 at which a newly arriving data word should be written and a read address pointer indicative of a location within FIFO 100 from which an existing data word should be read.

FIFO 100 may be operated as follows. Consider a scenario in which FIFO 100 is initially empty. When the FIFO is empty, a counter circuit such as counter 104 in circuit 102 may have a value of zero and read address pointer 118 and write address pointer 120 will be pointing to the same slot location within FIFO 100. Control circuit 102 may also be configured to assert signal EMPTY at output 110 when FIFO 100 contains no valid data. Only a write request will be granted when FIFO 100 is empty (i.e., the write enable output WE at terminal 124 will be high, whereas the read enable output RE at terminal 122 will be low). Because the write access request and read access requests may be controlled using different clocks, the write access requests and the read access requests may arrive synchronously or asynchronously at control circuit 102. FIFO control circuit 102 may include a counter circuit 104 configured to monitor the current state of FIFO 100 (e.g., to keep track of the number of valid data words that are currently stored in FIFO 100).

When control circuit 102 proceeds to service a write access request, circuit 102 will write the desired data word into a slot that the write address pointer is currently pointing. When the write access request has been fulfilled, the write address pointer may then be advanced to a next empty slot in FIFO 100 and the value of counter 104 may be incremented by one.

A read access request may be served as long as the value of counter 104 is at least equal to one (i.e., data can be read from a non-empty FIFO). When control circuit 102 proceeds to service a read access request, circuit 102 will read a data word from a slot that the read address pointer is currently pointing. When the read access request has been fulfilled, the read address pointer may then be advanced to a next occupied slot in FIFO 100 and the value of counter 104 may be decremented by one. The value of counter 104 may in general be proportional to the difference between the write address pointer and the read address pointer (e.g., count may be equal to the FIFO slot index of associated with the write address pointer minus the FIFO slot index associated with the read address pointer). Advancing the read/write address pointers in this way ensures that an earlier arriving data word will be read out before a later arriving data (to preserve the FIFO functionality).

In the example of FIG. 1, three data words are currently stored in FIFO 100 (e.g., count is equal to three). A new write request may write a new data word into slot 4, whereas a new read request may read out the existing data word in slot 3.

FIFO 100 may have a predetermined depth (sometimes referred to as the FIFO size or length). In the example of FIG. 1, FIFO 100 may be configured to store up to 1024 data words (e.g., FIFO 100 is 1024 slots deep). When counter 104 has a value that exceeds this predetermined threshold amount (e.g., when count reaches 1024), control circuit 102 may recognize that FIFO 100 is full and may assert signal FULL at output 112. When FIFO 100 is full, the read/write pointers will again be pointing to the same slot location within FIFO 100. Only a read request will be granted when FIFO is full (i.e., the read enable output RE at terminal 122 will be high, whereas the write enable output WE at terminal 124 will be low).

Figure 2:
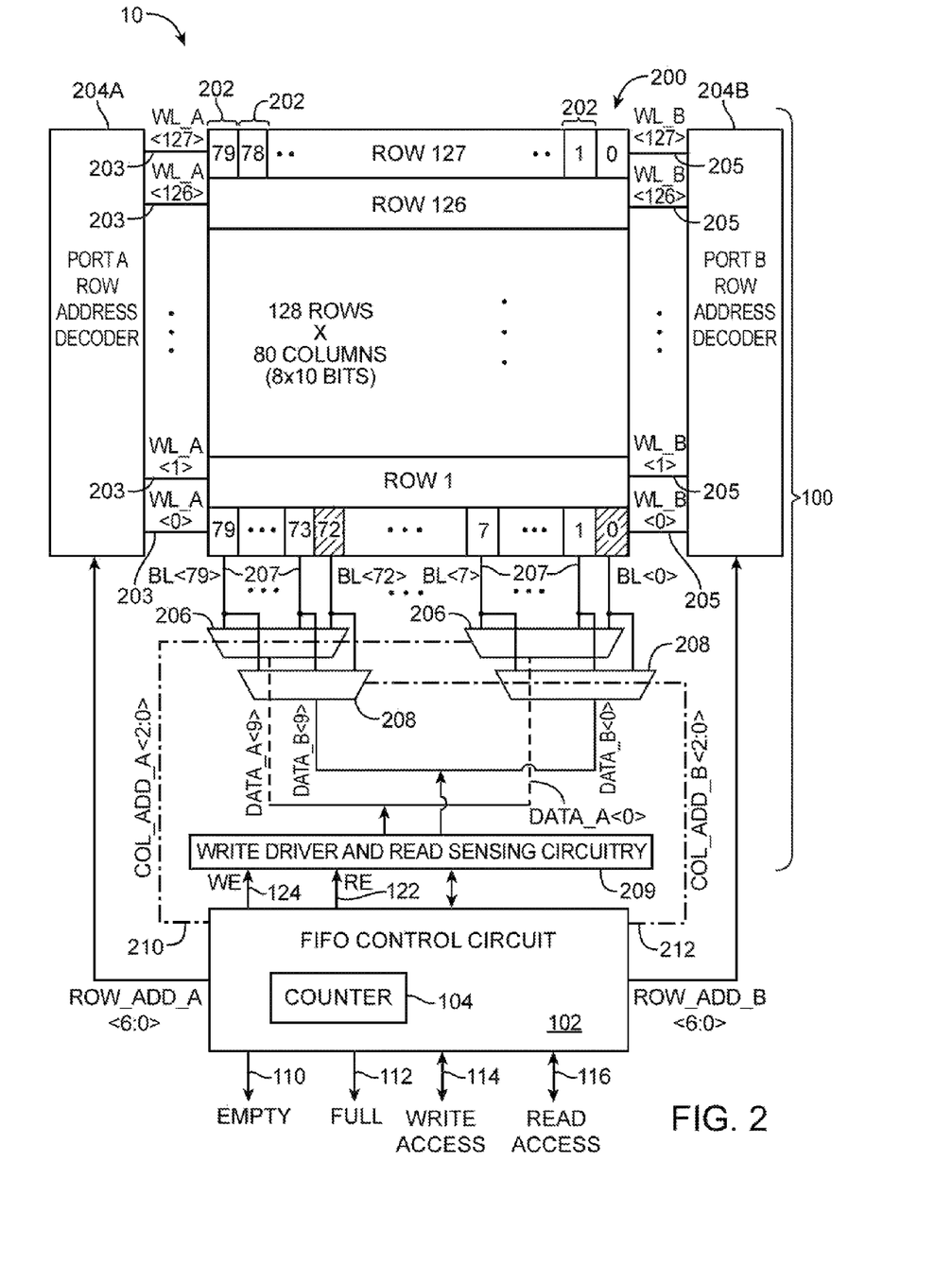
FIG. 2 is a diagram of an illustrative FIFO circuit implemented using dual-port memory in accordance with an embodiment of the present invention.

FIFO 100 may be implemented using multiport memory elements. FIG. 2 is a diagram showing FIFO 100 implemented using an array 200 of dual-port memory cells 202. In the example of FIG. 2, array 200 may include 128 rows and 80 columns of dual-port memory cells 202.

Each memory cell 202 in the same row may be coupled to port A row address decoder 204A via an associated port A word line 203 and may be coupled to port B row address decoder 204B via an associated port B word line 205. Word line signals WL_A (e.g., signals WL_A<127:0>) may be provided over word lines 203, whereas word line signals WL_B (e.g., signals WL_B<127:0>) may be provided over word lines 205. These word line signals may sometimes be referred to as address signals. During a port A access, address decoder 204A may assert one of word line signals WL_A to select a row of memory cells 202 for access. During a port B access, address decoder 204B may assert one of word line signals WL_B to select a row of memory cells 202 for access. During operation of FIFO 100, ports A and B may or may not select the same row of memory cells for access.

Each memory cell 202 in the same column may be coupled to an associated data line path 207. Each data line path 207 may, as an example, include at least first and second pairs of true and complement data lines (sometimes referred to as bit lines). The first pair of data lines 207 (referred to herein as port A data line pair) may be coupled to a corresponding port A column multiplexing circuit 206, whereas the second pair of data lines 207 (referred to herein as port B data line pair) may be coupled to port B column multiplexing circuit 208.

The number of multiplexers 206 may depend on the number of bits in the data word that is to be stored in each slot of FIFO 100 (i.e., the number of multiplexers 206 may depend on the desired data word width). For example, if each slot in FIFO 100 is configured to store 16 bits, 16 multiplexers 206 may be formed on device 10. The number of port B multiplexers 208 may be equal to the number of port A multiplexers 206.

The number of inputs in each multiplexer 206 may depend on the total number of columns in array 200. In particular, the number of inputs in multiplexer 206 may be equal to the total number of columns in array 200 divided by the total number of multiplexers 206. For example, if array 200 contains 240 columns and if there are only 16 multiplexers 206 (as described in the example above), each of the 16 multiplexers may include 15 inputs (240 divided by 16). The inputs of each multiplexer 206 may generally be coupled to the port A data line pairs 207 associated with consecutive cell columns. In general, multiplexer 208 may have the same number of inputs as multiplexer 207. Similarly, the inputs of each multiplexer 208 may be coupled to the port B data line pairs 207 associated with consecutive cell columns.

In the example of FIG. 2, the data word width is equal to ten bits. As a result, FIFO 100 may include ten multiplexers 206 and ten multiplexers 208. Because array 200 has 80 columns, multiplexers 206 and 208 may each have eight inputs (80 divided by ten). As shown in FIG. 2, a first multiplexer 206 may have inputs coupled to port A data line pairs associated with the first eight consecutive columns (e.g., BL<7:0>) in array 200, a second multiplexer 206 may have inputs coupled to port A data line pairs associated with the second eight consecutive columns (e.g., BL<15:8>) in array 200, . . . , and a tenth multiplexer 206 may have inputs coupled to port A data line pairs associated with the tenth eight consecutive columns (e.g., BL<79:72>) in array 200. Similarly, a first multiplexer 208 may have inputs coupled to port B data line pairs associated with the first eight consecutive columns (e.g., BL<7:0>) in array 200, a second multiplexer 208 may have inputs coupled to port B data line pairs associated with the second eight consecutive columns (e.g., BL<15:8>) in array 200, . . . , and a tenth multiplexer 208 may have inputs coupled to port B data line pairs associated with the tenth eight consecutive columns (e.g., BL<79:72>) in array 200. Arranged in this way, only one column can be selected for access in each group of eight consecutive columns.

Multiplexers 206 and 208 may each have an output at which a data signal can be provided. During a read access, multiplexer 206 and/or 208 may be configured to route signals from a selected one of its input to its output. The outputs of each multiplexer 206 may be combined to form a port A output data path on which data signals DATA_A<9:0> may be provided, whereas the outputs of each multiplexer 208 may be combined to form a port B output data path on which data signals DATA_B<9:0> may be provided (as an example). Data signals DATA_A and DATA_B provided in this way may be received using read sensing circuitry 209 such as sense amplifier circuitry. Read sensing circuitry 209 may then generate read data signals that are fed back to path 116 through FIFO control circuit 102.

The direction of data flow from memory array 200 to FIFO control circuit 102 described thus far relates to a read access. When performing a write access, the direction of data flow may be reversed (e.g., the terms "inputs" and "outputs" used in describing multiplexers 206 and 208 may be switched). For example, FIFO control circuit 102 may direct write driver circuitry 209 to write a word of data into a corresponding subset of memory cells 202 located along a selected row. FIFO control circuit 102 may generate an asserted write enable signal WE to enable write driver circuitry 209 during a write operation or may generate an asserted read enable signal RE to enable read sensing circuitry 209 during a read operation.

FIFO control circuit 102 may also be used to generate row address signals for controlling the row address decoders and column address signals for controlling the column multiplexers. In the example of FIG. 2, circuit 102 may be configured to generate port A row address signals ROW_ADD_A<6:0> to port A row address decoder and port B row address signals ROW_ADD_B<6:0> to port B row address decoder. The seven row address bits may be used to select among the 128 (i.e., 2^7) rows of array 200. Circuit 102 may be configured to generate port A column address signals COL_ADD_A<2:0> to a control input of each port A multiplexer 206 and to generate port B column address signals COL_ADD_B<2:0> to a control input of each port B multiplexer 208. The three column address bits may be used to select among the eight (i.e., 2^3) columns in array 200.

The dual-port memory circuitry described in connection with FIG. 2 is merely illustrative and does not serve to limit the scope of the present invention. If desired, memory array 200 may have any suitable number of rows and columns (and associated multiplexing circuit 206 and 208) for supporting the desired data word width.

Figure 3:
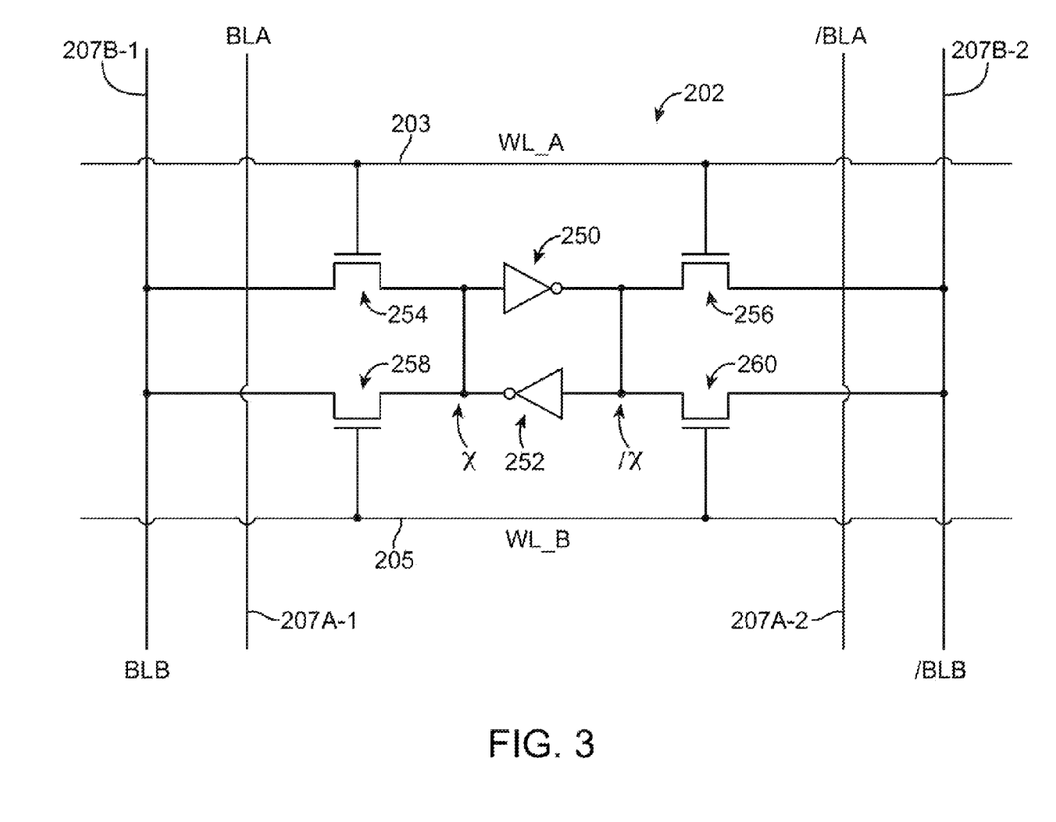
FIG. 3 is a diagram of an illustrative dual-port memory cell in accordance with an embodiment of the present invention.

FIG. 3 is a circuit diagram of illustrative dual-port memory cell 202. As shown in FIG. 3, cell 202 may include at least a pair of cross-coupled inverter 250 and 252 each having an input and an output. In particular, the output of inverter 250 may be coupled to the input of inverter 252, whereas the output of inverter 252 may be coupled to the input of inverter 250. The output of inverter 252 may serve as a first internal data storage node X for cell 202, whereas the output of inverter 250 may serve as a second internal data storage node /X for cell 202. Inverters 250 and 252 cross-coupled in this way may be used to store a single bit of data and may sometimes be collectively referred to as a bistable memory element or a latch.

A first pair of access transistors 254 and 256 may be coupled to the first and second data storage nodes, respectively. In particular, access transistor 254 may be coupled between first storage node X and a first port A data line 207A-1 (e.g., a data line on which true port A bit line signal BLA is provided), whereas access transistor 256 may be coupled between second data storage node /X and a second port A data line 207A-2 (e.g., a data line on which complement port A bit line signal /BLA is provided). A second pair of access transistors 258 and 260 may also be coupled between the first and second data storage nodes, respectively. In particular access transistor 258 may be coupled between first storage node X and a first port B data line 207B-1 (e.g., a data line on which true port A bit line signal BLB is provided), whereas access transistor 260 may be coupled between second data storage node /X and a second ort B data line 207B-2 (e.g., a data line on which complement port B bit line signal /BLB is provided).

Access transistors 254 and 256 may each have a gate that is coupled to port A word line 203. Word line signal WL_A provided over word line 203 may be used to control port A access. Access transistors 258 and 260 may each have a gate that is coupled to port B word line 205. Word line signal WL_B provided over word line 205 may be used to control port B access. Word line signals WL_A and WL_B are sometimes referred to as address signals. Access transistors 254, 256, 258, and 260 may therefore be referred to as address transistors. The first pair of address transistors may be used to provide port A access (e.g., FIFO write access), whereas the second pair of address transistors may be used to provide port B access (e.g., FIFO read access).

Figure 4:
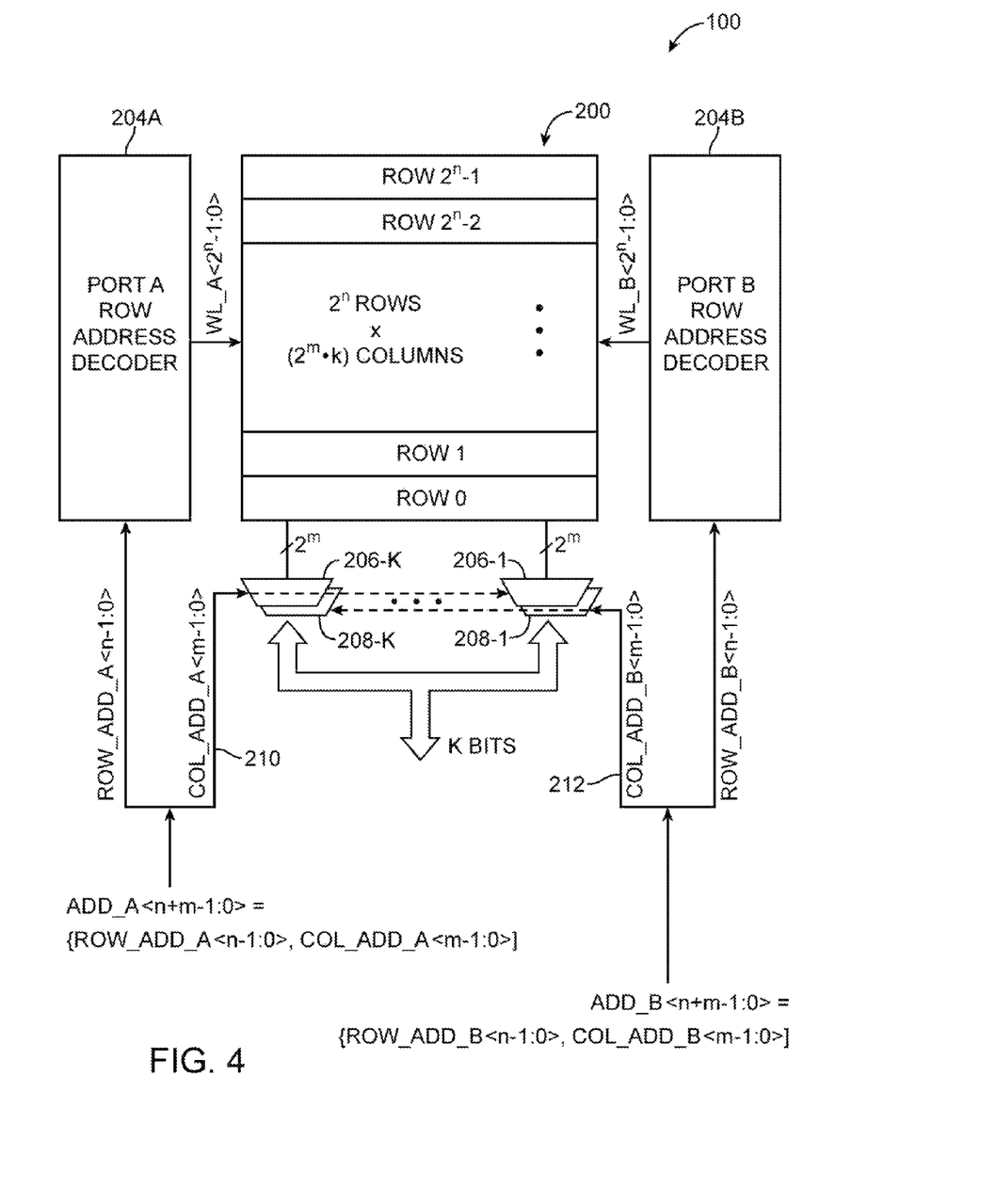
FIG. 4 is a diagram of illustrative dual-port memory array circuitry in accordance with an embodiment of the present invention.

In general, FIFO 100 may be implemented using dual-port memory array 200 having any number of rows and columns of dual-port memory cells. FIG. 4 is a diagram of memory array 200 having $2^n$ rows and ($2^m$*k) columns (e.g., for desired data word widths of k bits). Port A row address decoder 204A may be controlled using port A row addressing bits ROW_ADD_A<n-1:0>, whereas port B row address decoder 204B may be controlled using port B row addressing bits ROW_ADD_B<n-1:0>.

In this example, the memory circuitry may include k multiplexers 206 (e.g., port A column multiplexers 206-1, 206-2, . . . , 206-k) and k multiplexers 208 (e.g., port B column multiplexers 208-1, 208-2, . . . , 208-k), wherein each of multiplexers 206 and 208 has $2^m$ inputs coupled to associated columns 207. Multiplexers 206 may be controlled using port A column addressing bits COL_ADD_A<m−1:0> provided over path 210, whereas multiplexers 208 may be controlled using port B column addressing bits COL_ADD_B<m−1:0> provided over path 212. The port A addressing bits may be combined into a single write port address signal ADD_A<n+m−1:0> having a total of (n+m) bits (e.g., by concatenating ROW_ADD_A<n−1:0> with COL_ADD_A<m−1:0>), whereas the port B addressing bits may be combined into a single read port address signal ADD_B<n+m−1:0> also having a total of (n+m) bits (e.g., by concatenating ROW_ADD_B<n−1:0> with COL_ADD_B<m−1:0>).

When using the memory circuitry of FIG. 4 to implement FIFO 100, signal ADD_A may serve as a write address pointer while signal ADD_B may serve as a read address pointer. The write/read address pointers may be maintained by FIFO control circuit 102. When fulfilling a FIFO write request, a new data word may be written into a portion of memory array 200 that is currently being selected using ADD_A, and ADD_A may be incremented by one. When fulfilling a FIFO read request, an existing data word stored at a portion in array 200 that is currently being designated by ADD_B may be read out, and ADD_B may be incremented by one. Counter 104 may be used to monitor the difference between the write address pointer and the read address pointer (e.g., the value of counter 104 may reflect how far away ADD_B is trailing ADD_A).

Figure 5:
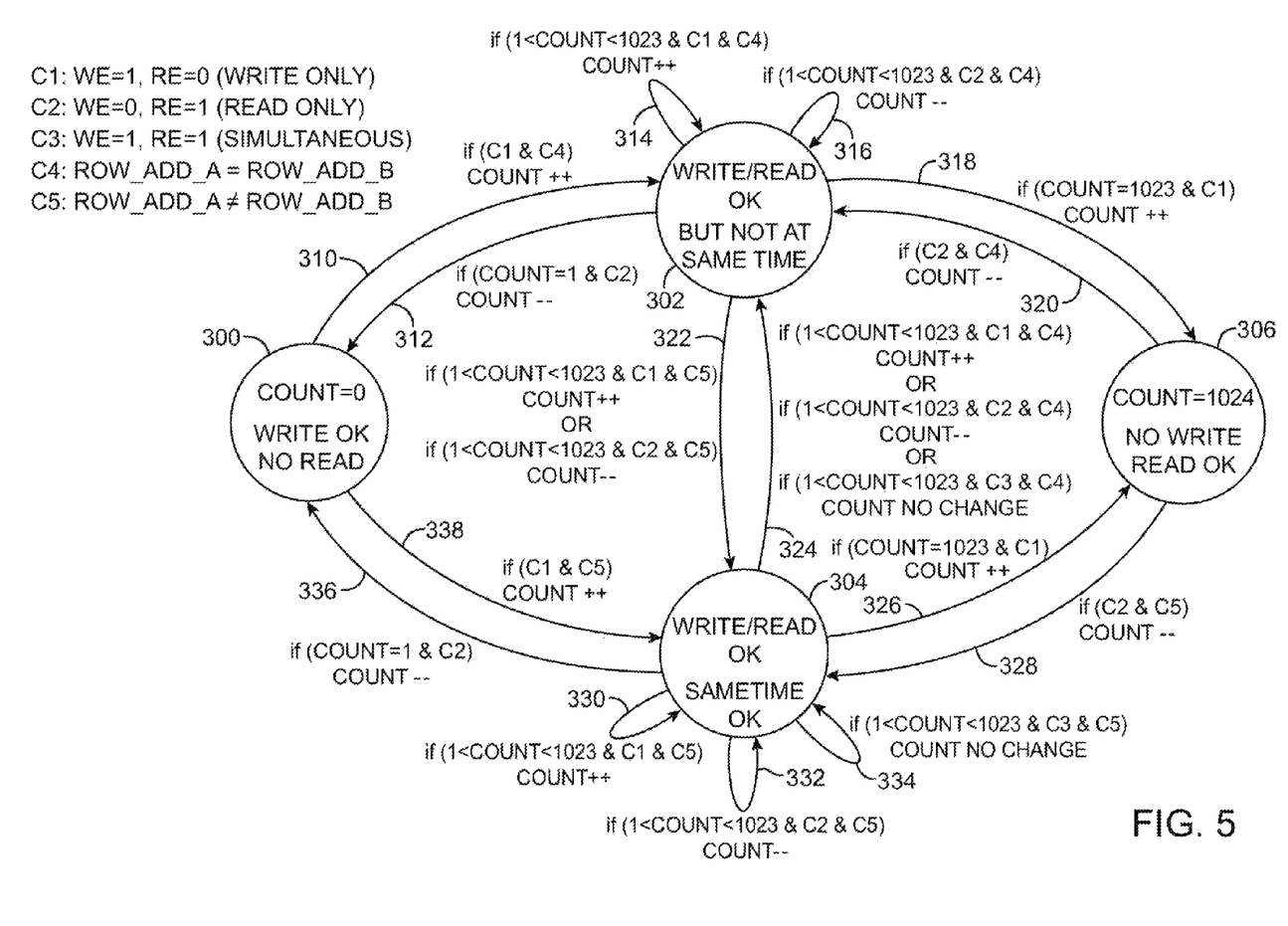
FIG. 5 is an illustrative state diagram for operating the FIFO circuit of the type shown in FIG. 2 in accordance with an embodiment of the present invention.

It may not be desirable to allow memory array 200 to simultaneously perform read and write accesses on the same row. One way of preventing simultaneous dual-port accesses along the same row is to compare the row addressing bits prior to enabling a write or read access. FIG. 5 is an exemplary state diagram showing how FIFO 100 of FIG. 2 may be operated. FIFO 100 may transition among different operating states depending on whether certain conditions are met. A first condition C1 is satisfied when only a write access is being performed (e.g., condition C1 is true when write enable WE is high and read enable RE is low). A second condition C2 is satisfied when only a read access is being performed (e.g., condition C2 is true when WE is low and RE is high). Condition C3 is satisfied when both read and write accesses are being simultaneously performed (e.g., condition C3 is true when WE and RE are high). Condition C4 is satisfied when port A row address ROW_ADD_A is equal to port B row address ROW_ADD_B (e.g., by comparing the n most significant bits of ADD_A and ADD_B). Condition C5 is true when ROW_ADD_A is not equal to ROW_ADD_B (e.g., when the n most significant bits of ADD_A are not identical to the n most significant bits of ADD_B).

FIFO 100 may initially be placed in empty state 300 upon startup (i.e., a state in which the value of counter 104 is equal to zero). When the FIFO is in state 300, only a write access may be allowed. If conditions C1 and C4 are true, FIFO 100 may transition from state 300 to state 302 and counter 104 may be incremented (as indicated by path 310). If conditions C1 and C5 are true, FIFO 100 may transition from state 300 to state 304 and counter 104 may be incremented (as indicated by path 338).

When FIFO 100 is in state 302, read and write access may be performed but not at the same time to prevent dual-port accesses along the same row. If the value of counter 104 is currently equal to one and if condition C2 is true, FIFO 100 may transition from state 302 back to state 300 and counter 104 may be decremented (as indicated by path 312). If the value of counter 104 is greater than one and less than 1023 and if conditions C1 and C5 are true, FIFO 100 may transition from state 302 to state 304 while counter 104 is incremented (as indicated by path 322). Similarly, if the value of counter 104 is greater than one and less than 1023 and if conditions C2 and C5 are true, FIFO 100 may also transition from state 302 to state 304 while counter 104 is decremented. If the value of counter 104 is equal 1023 and if condition C1 is true, FIFO 100 may transition from state 302 to state 306, and counter 104 may be incremented (as indicated by path 318). If the value of counter 104 is greater than one and less than 1023 and if conditions C1 and C4 are true, FIFO 100 may remain in state 302 while counter 104 is incremented (as indicated by path 314). Similarly, if the value of counter 104 is greater than one and less than 1023 and if conditions C2 and C4 are true, FIFO 100 may remain in state 302 while counter 104 is decremented (as indicated by path 316).

When FIFO 100 is in state 304, read and write accesses may be performed and simultaneous dual-port access is allowed because the row address bits are different. If the value of counter 104 is currently equal to one and if condition C2 is true, FIFO 100 may transition from state 304 back to state 300 and counter 104 may be decremented (as indicated by path 336). If the value of counter 104 is greater than one and less than 1023 and if conditions C1 and C4 are true, FIFO 100 may transition from state 304 to state 302 while counter 104 is incremented (as indicated by path 324). Similarly, if the value of counter 104 is greater than one and less than 1023 and if conditions C2 and C4 are met, FIFO 100 may also transition from state 304 to state 302 while counter 104 is decremented. If the value of counter 104 is greater than one and less than 1023 and conditions C3 and C4 are met, FIFO 100 may also transition from state 304 to state 302 while maintaining the value of the counter. If the value of counter 104 is equal 1023 and if condition C1 is true, FIFO 100 may transition from state 304 to state 306 and counter 104 may be incremented (as indicated by path 326). If the value of counter 104 is greater than one and less than 1023 and if conditions C1 and C5 are true, FIFO 100 may remain in state 304 while counter 104 is incremented (as indicated by path 330). Similarly, if the value of counter 104 is greater than one and less than 1023 and if conditions C2 and C5 are true, FIFO 100 may remain in state 304 while counter 104 is decremented (as indicated by path 332). If the value of counter 104 is greater than one and less that 1023 and if conditions C3 and C5 are true, FIFO 100 may remain in state 304 while counter 104 stays constant (e.g., simultaneous read and write accesses does not change count), as indicated by path 334.

State 306 indicates that FIFO 100 is full (e.g., the value of counter 104 is equal to predetermined threshold amount of 1024). When the FIFO is in state 306, only a read access may be allowed. If conditions C2 and C4 are true, FIFO 100 may transition from state 306 to state 302 and counter 104 may be decremented (as indicated by path 320). If conditions C2 and C5 are true, FIFO 100 may transition from state 306 to state 304 and counter 104 may be decremented (as indicated by path 328). The state diagram of FIG. 5 in which FIFO 100 is 1024 slots deep is merely illustrative and does not serve to limit the scope of the present invention. If desired, this approach may be extended to FIFOs of any size.

Figure 6:
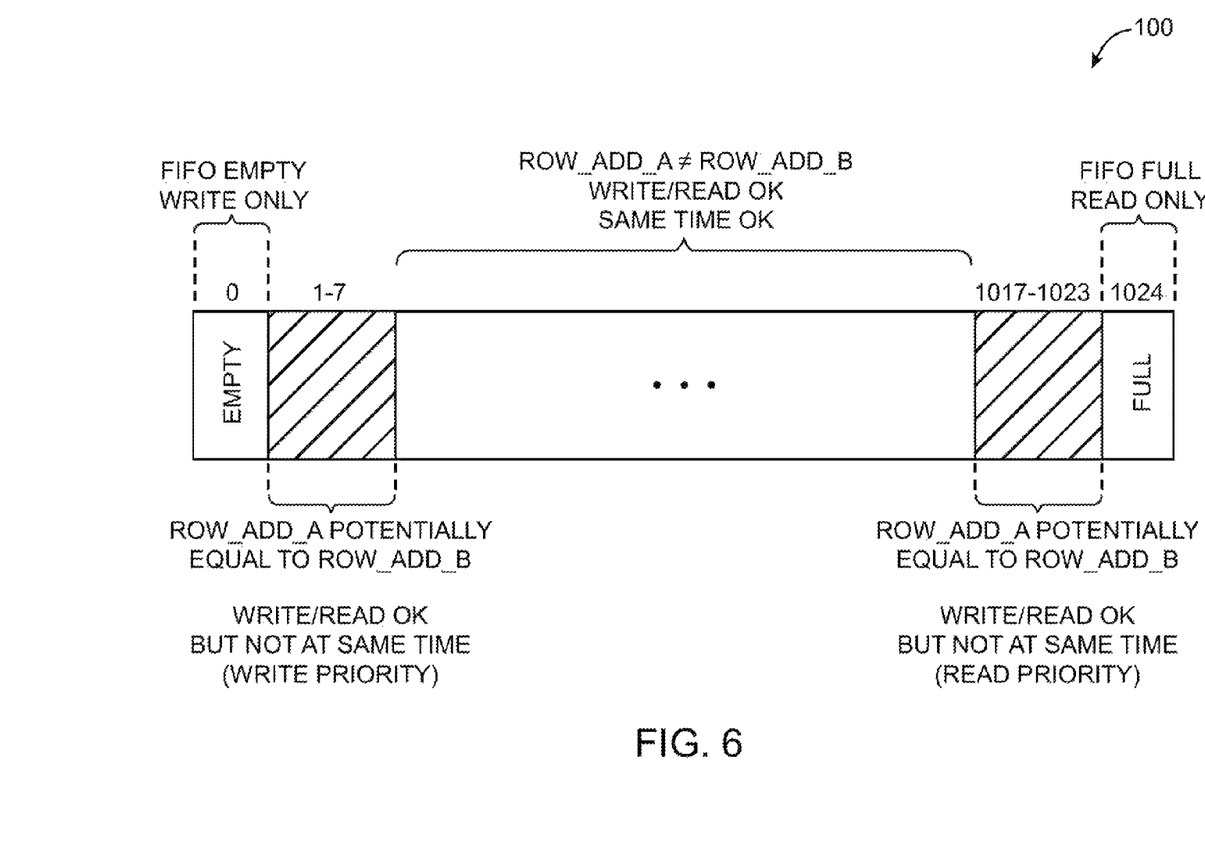
FIG. 6 is a block diagram of an illustrative FIFO circuit in accordance with an embodiment of the present invention.

In another suitable arrangement, simultaneous FIFO dual-port accessibility may be determined based only on the value of counter 104 and the number of column multiplexers that are coupled to array 200. FIG. 6 is a diagram showing one suitable arrangement for FIFO 100. FIFO 100 may, as an example, be 1024 slots deep. When count is equal to zero, only a write access is allowed (e.g., only a write can be performed when the FIFO is empty). When count is equal to 1024, only a read access is allowed (e.g., only a read can be performed when the FIFO is full). When count is greater than zero and less than eight, ROW_ADD_A can potentially be equal to ROW_ADD_B (because the read and write addresses are relatively close). Similarly, when count is greater than 1016 and less than 1024, ROW_ADD_A can potentially be equal to ROW_ADD_B. When the value of count falls in either of these two ranges (e.g., when count is between 1-7 or between 1017-1023 inclusive), read and write access are permitted but not at the same time. When count is between 1 and 7 and when read/write accesses arrive in parallel, the write access may be given priority (since the FIFO is relatively empty). When count is between 1017 and 1023 and when read/write accesses arrive in parallel, the read access may be given priority (since the FIFO is relatively full). When count is greater than 7 and less than 1017, ROW_ADD_A will not be equal to ROW_ADD_B, so read and write accesses may be performed in parallel.

Figure 7:
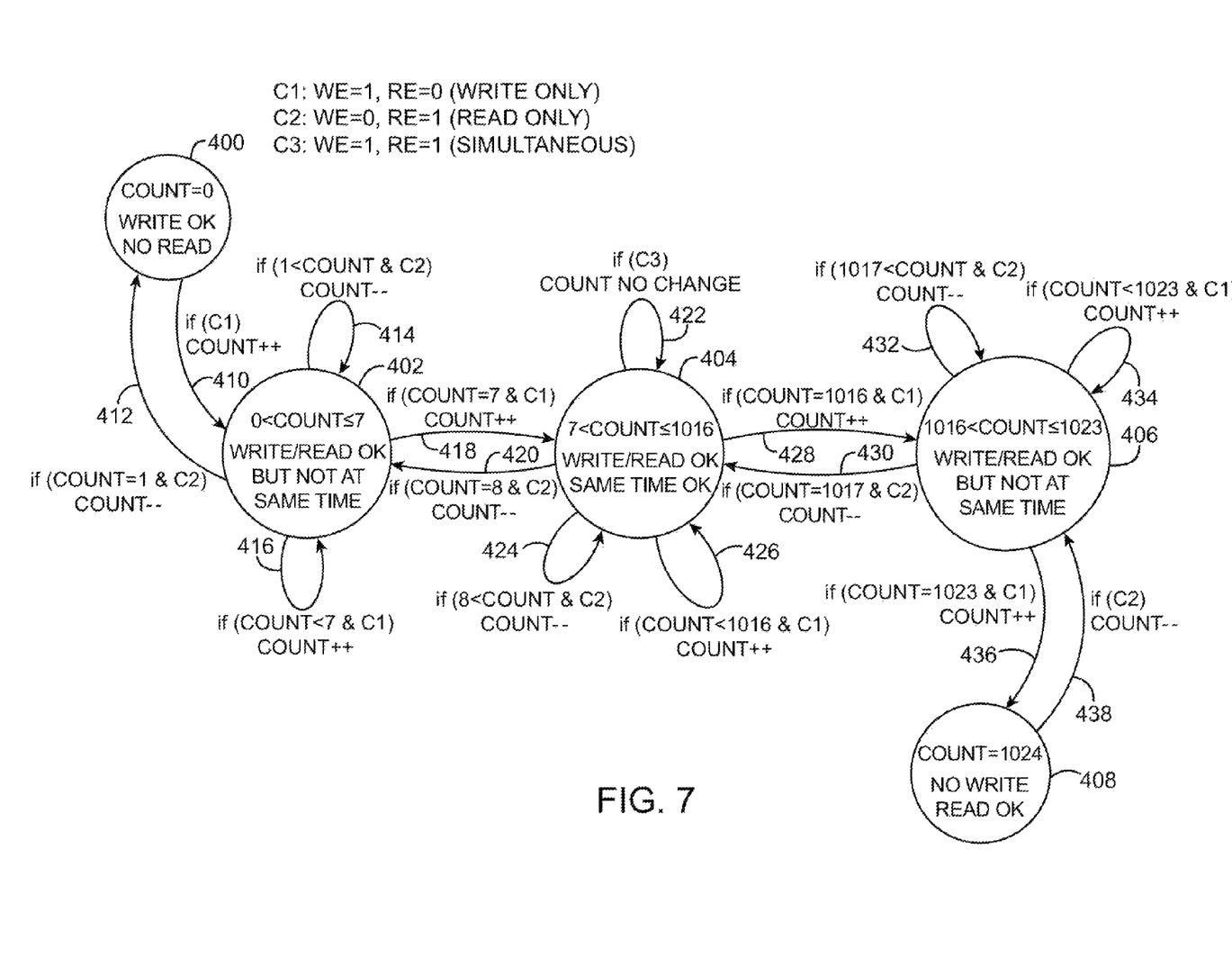
FIG. 7 is an illustrative state diagram for operating the FIFO circuit of the type shown in FIG. 2 in accordance with an embodiment of the present invention.

FIG. 7 is an exemplary state diagram showing how FIFO 100 of FIG. 6 may be operated. FIFO 100 may transition among different operating states depending on whether certain conditions are met. A first condition C1 is satisfied when only a write access is being performed (e.g., condition C1 is true when write enable WE is high and read enable RE is low). A second condition C2 is satisfied when only a read access is being performed (e.g., condition C2 is true when WE is low and RE is high). Condition C3 is satisfied when both read and write accesses are being simultaneously performed (e.g., condition C3 is true when WE and RE are high).

FIFO 100 may initially be placed in empty state 400 upon startup (i.e., a state in which the value of counter 104 is equal to zero). When the FIFO is in state 300, only a write access may be allowed. If condition C1 is true, FIFO 100 may transition from state 400 to state 402 and counter 104 may be incremented (as indicated by path 410).

When FIFO 100 is in state 402, read and write accesses may be performed but not at the same time to prevent dual-port access along the same row. If the value of counter 104 is currently equal to one and if condition C2 is true, FIFO 100 may transition from state 402 back to state 400 and counter 104 may be decremented (as indicated by path 412). If the value of counter 104 is currently equal to seven and if condition C1 is true, FIFO 100 may transition from state 402 to state 404 and counter 104 may be incremented (as indicated by path 418). If the value of counter 104 is greater than one and condition C2 is true, FIFO 100 may remain in state 402 and count may be decremented (as indicated by path 414). If the value of counter 104 is less than seven and condition C1 is true, FIFO 100 may remain in state 402 and count may be incremented (as indicated by path 416).

When FIFO 100 is in state 404, read and write accesses may be allowed to be performed in parallel. If the value of counter 104 is equal to eight and condition C2 is true, FIFO 100 may transition from state 404 back to state 402 and count may be decremented (as indicated by path 420). If the value of counter 104 is equal to 1016 and condition C1 is true, FIFO 100 may transition from state 404 to state 406 and count may be incremented (as indicated by path 428). If the value of counter 104 is greater than eight and condition C2 is true, FIFO 100 may remain in state 404 and count may be decremented (as indicated by path 424). If the value of counter 104 is less than 1016 and condition C1 is true, FIFO 100 may remain in state 404 and count may be incremented (as indicated by path 426). If condition C3 is true, FIFO 100 may remain in state 404 while counter 104 stays constant (e.g., simultaneous read and write accesses does not change count), as indicated by path 422.

When FIFO 100 is in state 406, read and write accesses may be performed but not at the same time to prevent simultaneous dual-port accesses along the same row. If the value of counter 104 is currently equal to 1017 and if condition C2 is true, FIFO 100 may transition from state 406 back to state 404 and counter 104 may be decremented (as indicated by path 430). If the value of counter 104 is currently equal to 1023 and if condition C1 is true, FIFO 100 may transition from state 406 to state 408 and counter 104 may be incremented (as indicated by path 436). If the value of counter 104 is greater than 1017 and condition C2 is true, FIFO 100 may remain in state 406 and count may be decremented (as indicated by path 432). If the value of counter 104 is less than 1023 and condition C1 is true, FIFO 100 may remain in state 406 and count may be incremented (as indicated by path 434).

State 408 indicates that FIFO 100 is full (e.g., the value of counter 104 is equal to predetermined threshold amount of 1024). When the FIFO is in state 408, only a read access may be granted. If condition C2 is true, FIFO 100 may transition from state 408 to state 406 and counter 104 may be decremented (as indicated by path 438).

The state diagram of FIG. 7 in which FIFO 100 has a size of 1024 is merely illustrative and does not serve to limit the scope of the present invention. This approach may be extended for FIFOs of any suitable size. The ranges of count in which simultaneous dual-port access is not allowed may be dependent on the number of column multiplexers 206 and 208 coupled to array 200. For example, consider a scenario in which array 200 is used implement a 256-deep FIFO and is coupled to ten 4-to-1 multiplexers 206 and ten 4-to-1 multiplexers 208. In this example, state 402 may correspond to counter 104 having a value greater than zero and less than four (sometimes referred to as a first predetermined threshold amount), whereas state 406 may correspond to counter 104 having a value greater than 252 (sometimes referred to as a second predetermined threshold amount) and less than 256.

The foregoing is merely illustrative of the principles of this invention and various modifications can be made by those skilled in the art without departing from the scope and spirit of the invention. The foregoing embodiments may be implemented individually or in any combination.

What is claimed is:

1. A buffer circuit comprising:
   an array of multiport memory elements;
   at least first and second addressing circuits coupled to the array; and
   a control circuit having a first input operable to receive a first access request and a second input operable to receive a second access request, wherein the control circuit is operable to generate a first address signal to the first addressing circuit, to generate a second address signal to the second addressing circuit, and to compare the first and second address signals to determine whether the read and write access requests are to be simultaneously serviced.

2. The buffer circuit defined in claim 1 wherein the buffer circuit comprises a first-in-first-out circuit formed on an integrated circuit.

3. The buffer circuit defined in claim 2 wherein the multiport memory elements comprise dual-port memory elements.

4. The buffer circuit defined in claim 2 wherein the first access request comprises a write access request.

5. The buffer circuit defined in claim 4 wherein the second access request comprises a read access request.

6. The buffer circuit defined in claim 5 further comprising:
   write driver circuitry and read sensing circuitry coupled to the array, wherein the control circuit is further operable to supply an asserted write enable signal to the write driver circuitry when fulfilling the write access request and to supply an asserted read enable signal to the read sensing circuitry when fulfilling the read access request.

7. The buffer circuit defined in claim 2 wherein the control circuit includes a counter circuit operable to keep track of an amount of data that is currently being stored in the buffer circuit.

8. The buffer circuit defined in claim 2 wherein the first and second addressing circuits comprise address decoders.

9. The buffer circuit defined in claim 2 further comprising:
   column multiplexers that are coupled to the array and that are operable to receive column addressing signals from the control circuit.

10. A method for operating a buffer circuit, wherein the buffer circuit includes an array of multiport memory elements that is coupled to at least first and second addressing circuits, the method comprising:
    with a control circuit, receiving a first request at its first input and receiving a second request at its second input;
    with the first addressing circuit, receiving first address signals from the control circuit;
    with the second addressing circuit, receiving second address signals from the control circuit; and
    with the control circuit, comparing the first and second address signals to determine whether the first and second requests are to be simultaneously fulfilled.

11. The method defined in claim 10 wherein the buffer circuit comprises a first-in-first-out circuit and wherein receiving the first request at the first input comprises receiving a write access request at the first input of the control circuit.

12. The method defined in claim 11 wherein receiving the second request at the second input comprises receiving a read access request at the first second of the control circuit.

13. The method defined in claim 10 further comprising:
    in response to determining that the first and second address signals are identical, simultaneously servicing the first and second requests.

14. The method defined in claim 10 further comprising:
    in response to determining that the first and second address signals are different, servicing the first request before servicing the second request.

15. The method defined in claim 10, wherein the control circuit includes a counter circuit, further comprising:
    with the counter circuit, monitoring an amount of data that is currently being stored in the buffer circuit.

16. A method for operating a buffer circuit, wherein the buffer circuit includes an array of multiport memory elements, the method comprising:
    with a control circuit, receiving a first request at its first input and receiving a second request at its second input;
    with a monitoring circuit in the control circuit, keeping track of an amount of data that is currently stored in the buffer circuit; and
    in response to detecting that the amount of data in the buffer circuit is within an acceptable range, simultaneously servicing the first and second requests.

17. The method defined in claim 16 wherein the buffer circuit comprises a first-in-first-out circuit, wherein receiving the first request at the first input comprises receiving a write access request at the first input of the control circuit, and wherein receiving the second request at the second input comprises receiving a read access request at the second input of the control circuit.

18. The method defined in claim 16 further comprising:
    in response to determining that the amount of data in the buffer circuit is out of the acceptable range, servicing the first request before servicing the second request.

19. The method defined in claim 16 wherein the monitoring circuit comprises a counter circuit having a value and wherein keeping track of the amount of data that is currently being stored in the buffer circuit comprises:
    incrementing the value of the counter circuit when servicing the first request; and
    decrementing the value of the counter circuit when servicing the second request.

20. The method defined in claim 16 further comprising:
    with the control circuit, generating first and second addressing signals that control the array;
    advancing the first address signal in response to servicing the first request; and
    advancing the second address signal in response to servicing the second request.

* * * * *